US007008178B2

(12) United States Patent
Busch et al.

(10) Patent No.: US 7,008,178 B2

(45) Date of Patent: Mar. 7, 2006

(54) INBOARD COOLED NOZZLE DOUBLET

(75) Inventors: Duane Allan Busch, Loveland, OH (US); Melissa Wise Starkweather, Cincinnati, OH (US); Andrew Charles Powis, Madeira, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/738,514

(22) Filed: Dec. 17, 2003

(65) Prior Publication Data

US 2005/0135921 A1 Jun. 23, 2005

(51) Int. Cl.
*F01D 9/04* (2006.01)

(52) U.S. Cl. .................. 415/115; 415/208.2; 416/96 A

(58) Field of Classification Search ................ 415/115, 415/191, 208.2; 416/175, 97 R, 96 A, 241 B
See application file for complete search history.

(56) References Cited

U.S. PATENT DOCUMENTS 6,077,036 A 6/2000 Heffron et al. ............. 415/115
6,183,192 B1 2/2001 Tressler et al. ............. 415/115
6,485,590 B1 11/2002 Ivkovich et al.
6,609,880 B1 8/2003 Powis et al. ................... 415/1
6,783,323 B1 * 8/2004 Shiozaki et al. ............ 415/115
2003/0113201 A1 * 6/2003 Powis et al. ................... 415/1

* cited by examiner

*Primary Examiner*—Edward K. Look
*Assistant Examiner*—Richard A. Edgar
(74) *Attorney, Agent, or Firm*—William S. Andes; Francis L. Conte

(57) ABSTRACT

A turbine nozzle includes outer and inner bands integrally joined to a doublet of hollow vanes extending radially therebetween. Each of the vanes includes opposite pressure and suction sidewalls extending between opposite leading and trailing edges, and spaced apart to define an internal plenum extending radially between the bands for receiving an air coolant. The vanes are spaced apart from each other to define a flow passage for channeling hot combustion gases which are bound by corresponding pressure and suction sidewalls of the vanes facing inboard toward each other, with the remaining suction and pressure sidewalls of the vanes facing outboard. The vanes include different cooling configurations to bias more of the coolant to the inboard sidewalls than to the outboard sidewalls.

36 Claims, 6 Drawing Sheets

INBOARD COOLED NOZZLE DOUBLET

BACKGROUND OF THE INVENTION

The present invention relates generally to gas turbine engines, and, more specifically, to turbine nozzles therein.

In a gas turbine engine, air is pressurized in a compressor and mixed with fuel in a combustor for generating hot combustion gases. Energy is extracted from the gases in corresponding turbines which power the compressor, and provide useful work by powering an upstream fan in an exemplary turbofan aircraft engine application.

A high pressure turbine (HPT) directly follows the combustor and receives the hottest combustion gases therefrom. The HPT may have one or more stages therein joined by a shaft to power the compressor.

The LPT typically has several stages following the HPT and is joined by another shaft to the upstream fan in the turbofan application, or instead the shaft may extend externally of the engine for providing output power to drive an electrical generator or transmission in various marine and industrial applications.

Each turbine stage includes a stationary turbine nozzle having a row of stator vanes which direct combustion gases in the downstream direction. A corresponding row of turbine rotor blades follows the nozzle vanes and extracts energy from the combustion gases for in turn rotating the blades on a supporting rotor disk joined to the corresponding drive shaft.

Each nozzle vane has a corresponding crescent or airfoil configuration specifically configured for directing the combustion gases into the downstream row of rotor blades for maximizing energy extraction from the combustion gases. Each vane includes a generally concave pressure side and a circumferentially opposite, generally convex suction side extending axially between corresponding leading and trailing edges, and radially in span between outer and inner supporting bands.

In view of the hostile environment of the combustion gases, the nozzle vanes themselves are typically hollow and joined in flow communication with the compressor for receiving air bled therefrom for use as a coolant in cooling the nozzle vanes during operation against the external thermal loads applied by the hot combustion gases. Any air diverted from the combustion process for cooling the nozzle vanes correspondingly decreases the overall efficiency of the engine, and therefore should be minimized.

The prior art is replete with various configurations for cooling turbine nozzles, which vary in complexity, effectiveness, and in cost of manufacture.

Nozzle materials are typically formed of state-of-the-art nickel-based superalloys which retain strength in the high temperature environment of gas turbines. The superalloy materials nevertheless require suitable cooling during operation for enhancing the useful life and durability of the nozzle during operation.

Further enhancement and nozzle protection in the hostile environment of gas turbines may be achieved by using conventional thermal barrier coatings (TBCs). The TBC is typically a ceramic material which covers the external surfaces of the nozzle-vanes and corresponding flow bounding surfaces of the bands for providing a thermal insulation barrier against the hot combustion gases. The TBC protects the external surfaces of the nozzle vanes, and the internal surfaces thereof may be suitably cooled by the air coolant channeled therethrough during operation.

For example, the hollow nozzle vanes may include impingement inserts or baffles which have suitable patterns of small impingement cooling holes extending therethrough. The baffles are formed of thin superalloy metal, and are spaced from the internal surfaces of the vane sidewalls for permitting the coolant to firstly impinge against those internal surfaces for extracting heat therefrom, with the spent impingement air then being discharged through suitable outlets in the vanes.

Such outlets may include rows of film cooling holes extending through the vane sidewalls, which are typically inclined aft for discharging cooling air in a film that provides an additional thermal barrier or insulation layer between the vane and hot combustion gases. Each vane may also include a row of trailing edge outlet holes which discharge another portion of the spent impingement air through the thin trailing edge for enhanced cooling thereof. And, additional outlet or dump holes may be provided in the supporting bands for discharging additional air therethrough.

The exemplary features described above, among others, increase the sophistication and complexity of manufacturing turbine nozzles, and are necessarily tailored to match the cooling requirements of the different portions of the nozzle against the different thermal loads applied by the combustion gases as they flow with different velocity distributions over the pressure and suction sides of the vanes.

The manufacturing process also affects the design of the nozzle. For example, a typical turbine nozzle is divided into a number of nozzle segments around the perimeter thereof to eliminate the hoop constraint of a unitary ring, and thereby reduce the magnitude of thermal stresses generated during operation. A typical nozzle segment includes a pair of nozzle vanes integrally joined to corresponding arcuate outer and inner bands, with adjoining nozzle segments being sealed together at corresponding axial splitlines by straight spline seals therein. The nozzle segment doublet may be manufactured from constituent parts and then assembled or brazed together, but is typically manufactured in a common casting including the outer and inner band segments and the pair of hollow nozzle vanes.

The impingement baffles are separately manufactured and later installed into corresponding cavities or plenums in the vanes during the assembly process.

The TBC is typically applied using a suitable vapor deposition process to coat the nozzle vanes with a sufficient amount of the TBC material. The film cooling holes may be formed through the nozzle vanes prior to applying the TBC using a suitable drilling process such as electrical discharge machining (EDM). Since the nozzle trailing edge holes are typically formed in the casting process to provide flow communication with the plenums inside the vanes, the trailing edge region of the vanes is preferably masked during the TBC deposition process to prevent clogging of those apertures.

Since the typical nozzle is an annular or axisymmetric assembly, the nozzle segments and vanes are typically identical around the perimeter of the nozzle. Furthermore, the impingement baffles with various patterns of cooling holes in the nozzle vanes are also identical from vane to vane. This therefore limits the number of different parts and drawings required in making the turbine nozzle.

The identical nozzle vanes and their identical cooling configurations therefore ensure substantially identical performance of the turbine nozzle vanes during operation in the engine, with the life or durability of the nozzle being affected by random differences within the manufacturing tolerances of the nozzle parts, and random differences in the distribution of the combustion gases.

However, since the typical TBC vapor deposition process is directional, it is not possible to evenly deposit the TBC over the full external surfaces of the nozzle sidewalls in the doublet configuration. Since the TBC is applied to each nozzle doublet individually, the exposed or outboard surfaces thereof may be readily coated with the TBC to the desired nominal or full thickness thereof, whereas the hidden or inboard surfaces of the nozzle doublet may only be partially coated with a thinner thickness of the TBC.

More specifically, the doublet pair includes a first or leading vane whose convex suction side faces circumferentially outwardly at the corresponding splitline. The second or trailing vane of the doublet has its concave pressure side facing outwardly towards the opposite splitline. The concave pressure side of the leading vane therefore faces circumferentially inwardly toward the opposing convex suction side of the trailing vane, and therefore both of these inboard sidewalls are hidden from the outside of the nozzle by the shadowing effect of their opposite sidewalls in the vanes.

Accordingly, during the TBC vapor deposition process, the trailing vane casts a shadow in the vapor deposition over the inboard pressure side of the leading vane and results in thinner application of the TBC thereon. Correspondingly, the leading vane casts a shadow over the inboard convex suction side of the trailing vane during the TBC vapor deposition process resulting in a correspondingly thin deposition of the TBC thereon.

In contrast, the entire convex suction side of the leading vane faces outboard and may be fully coated with the TBC. And, the entire concave pressure side of the trailing vane faces outboard and may also be fully coated with the TBC. And, the opposite leading and trailing edges also face outboard and may be suitably coated to the desired full thickness.

Since the resulting nozzle doublet coated with TBC in this process would have partial thickness TBC along the pressure side of the leading vane and along the suction side of the trail vane the uniformity or identicality between the two nozzle vanes would be prevented. Correspondingly, cooling performance of the two nozzle vanes would no longer be identical.

Accordingly, conventional practice used in the US for many years introduces suitable masks during the TBC vapor deposition process to effectively create dummy nozzle vanes aligned with the outboard sidewalls of the doublet vanes, typically in the positions of the next adjacent vanes in the fully assembled nozzle ring. In this way, the dummy masks may be used to ensure that the outboard suction side of the lead vane receives partial thickness TBC in the same manner as the inboard suction sidewall of the trail vane.

Correspondingly, the opposite mask ensures that the outboard pressure sidewall of the trail vane receives partial thickness TBC in the same manner as the partial thickness of the TBC on the inboard pressure side of the lead vane.

In this way, the two nozzle vanes in the nozzle doublet segment have substantially identical configurations, and may be similarly cooled during operation using the identical configurations of the impingement baffles and various outlet apertures through the nozzle vanes.

Although the typical nozzle vanes manufactured in accordance with this conventional process therefore have substantially identical cooling system design, the nozzle segments are in fact not subject to identical loading during operation. For example, although the nozzle flow passages between adjacent vanes are substantially identical for channeling the combustion gases therethrough, the circumferential continuity of the nozzle is interrupted by the segment configuration, which in turn affects distribution of the loads in each nozzle segment.

The gas pressure loads are reacted by the nozzle vanes during operation and are carried through the nozzle bands to the corresponding nozzle support. And, the nozzle vanes and their bands are subject to different temperatures during operation which differently expand and contract these components, which in turn leads to differences in thermal loading thereof.

For example, the arcuate outer and inner bands of the nozzle segments are initially aligned in corresponding hoops prior to being heated by the combustion gases. As the gases heat the nozzle segments, the outer band in particular tends to straighten along its chord between the opposite splitlines, which distortion is restrained by the two nozzle vanes attached thereto.

This chording effect introduces additional thermal stress in the inboard sidewalls of the two pressure and suction sides which face each other in the nozzle doublet. And, the outboard sidewalls of the two nozzle vanes defined by the pressure and suction sides exposed at the splitlines experience different thermal loading. The corresponding thermal distortion of the nozzle doublets and the thermal stress introduced thereby adversely affects the durability or useful life of the nozzle segment.

Accordingly, it is desired to provide a turbine nozzle having custom cooling for reducing the adverse effects of the different thermal loading therein.

BRIEF DESCRIPTION OF THE INVENTION

A turbine nozzle includes outer and inner bands integrally joined to a doublet of hollow vanes extending radially therebetween. Each of the vanes includes opposite pressure and suction sidewalls extending between opposite leading and trailing edges, and spaced apart to define an internal plenum extending radially between the bands for receiving an air coolant. The vanes are spaced apart from each other to define a flow passage for channeling hot combustion gases which are bound by corresponding pressure and suction sidewalls of the vanes facing inboard toward each other, with the remaining suction and pressure sidewalls of the vanes facing outboard. The vanes include different cooling configurations to bias more of the coolant to the inboard sidewalls than to the outboard sidewalls.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

DETAILED DESCRIPTION OF THE INTENTION

Figure 1:
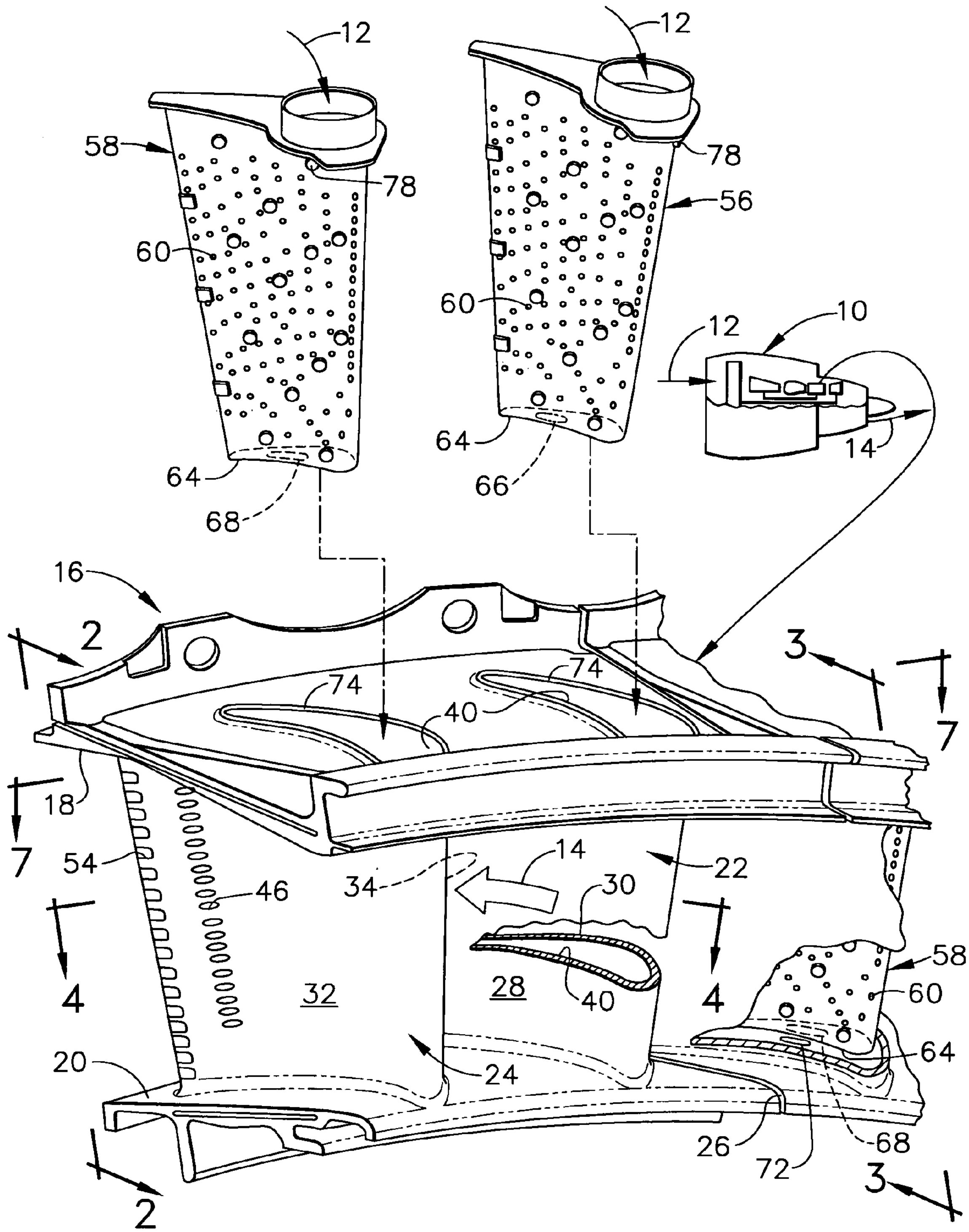
FIG. 1 is an exploded partly sectional isometric view of a portion of an exemplary turbine nozzle of a turbofan aircraft engine.

Illustrated schematically in FIG. 1 is a gas turbine engine 10 in the exemplary form of a turbofan aircraft engine. The engine itself may have any conventional configuration and typically includes in serial flow communication a fan, multistage axial compressor, combustor, high pressure turbine (HPT), and low pressure turbine (LPT) which are axisymmetrical about a longitudinal or axial centerline axis of the engine.

The HPT includes rotor blades supported from a rotor disk and joined by a shaft to corresponding rotor blades of the compressor. The LPT includes rotor blades extending from a rotor disk joined by another shaft to the fan.

During operation, air 12 flows through the engine and is pressurized by the compressor and mixed with fuel in the combustor for generating hot combustion gases 14 from which energy is extracted in the turbines prior to discharge from the outlet nozzle of the engine.

In the exemplary configuration illustrated in FIG. 1, the HPT includes first and second stages having corresponding nozzle vanes and rotor blades. The second stage turbine nozzle 16 is illustrated in part in FIG. 1 in accordance with an exemplary embodiment and is axisymmetrical about the longitudinal or centerline axis of the engine. The first stage nozzle and remaining components of the engine may have any conventional configuration.

The turbine nozzle 16 illustrated in FIG. 1 is circumferentially segmented in a conventional manner for interrupting the hoop continuity thereof. In particular, each segment of the nozzle includes radially outer and inner arcuate bands 18,20 integrally joined to a pair or doublet of hollow airfoil vanes 22,24 extending radially in span between the bands. The two vanes and two bands are preferably manufactured in a common or unitary casting thereof, although in an alternate embodiment these parts could be separately manufactured and brazed together.

The two vanes and bands therefore define a nozzle segment or doublet which adjoins adjacent segments at corresponding axial splitlines 26 to complete the full annular nozzle. Conventional spline seals (not shown) are located in the splitlines for sealing together the adjoining outer bands in the outer ring and the adjoining inner bands in the inner ring.

Figure 2:
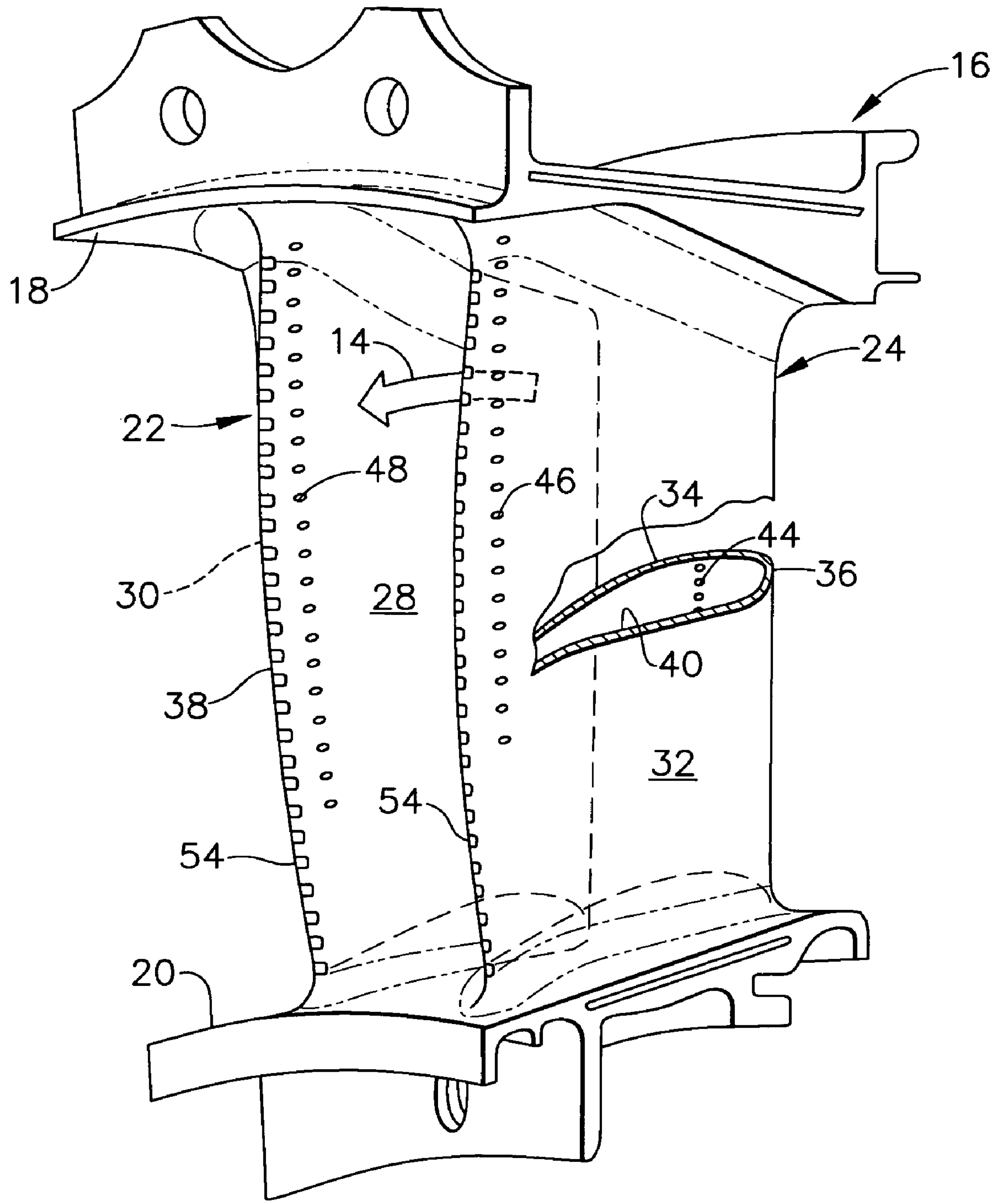
FIG. 2 is an aft-facing-forward isometric view of the pressure sides of the turbine nozzle illustrated in FIG. 1, and taken generally along line 2—2.
Figure 3:
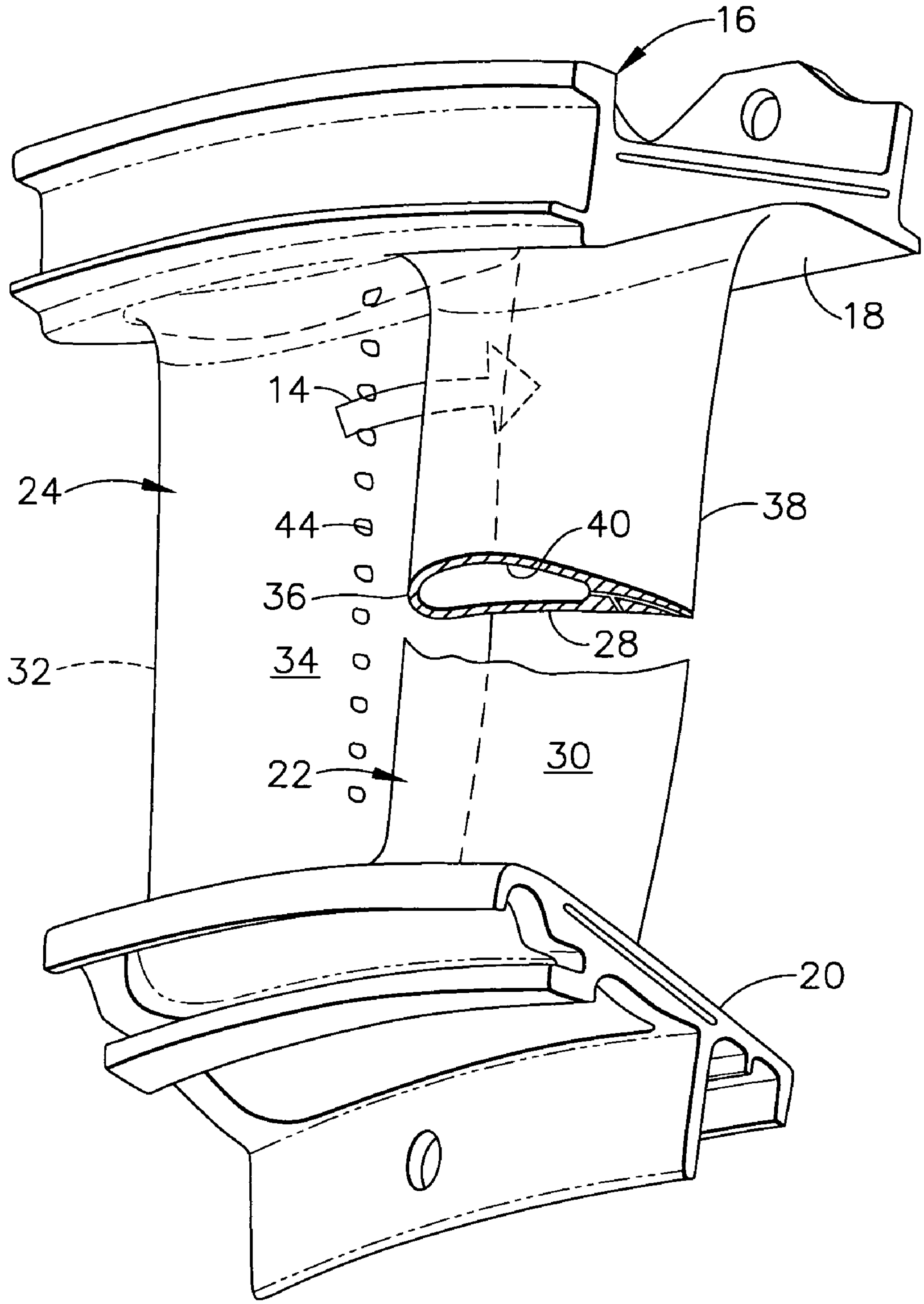
FIG. 3 is a forward-facing-aft isometric view of the suction sides of the nozzle illustrated in FIG. 1 and taken generally along line 3—3.

FIG. 2 illustrates from the trailing edge the pressure sides of the nozzle vanes. FIG. 3 illustrates from the leading edge the suction sides of the nozzle vanes. And, FIG. 4 illustrates in radial sectional view the circumferential alignment of the two nozzle vanes in each nozzle segment.

More specifically, the first vane 22 illustrated in these figures includes a generally concave, pressure sidewall 28 and a circumferentially opposite, generally convex suction sidewall 30. Similarly, the second vane 24 includes a generally concave pressure sidewall 32, and a circumferentially opposite, generally convex suction sidewall 34.

The aerodynamic profiles or configurations of the two vanes 22—24 are identical to each other with the corresponding pressure and suction sidewalls thereof extending axially between opposite leading and trailing edges 36,38 which extend radially in span between the outer and inner bands. The corresponding sidewalls of each vane are spaced circumferentially apart from each other to define corresponding internal cavities or plenums 40 extending radially between the bands for receiving the pressurized air 12 suitably bled from the compressor for use as a coolant in each vane for cooling the vane against the thermal load imposed by the hot combustion gases 14 flowing thereover during operation.

Figure 4:
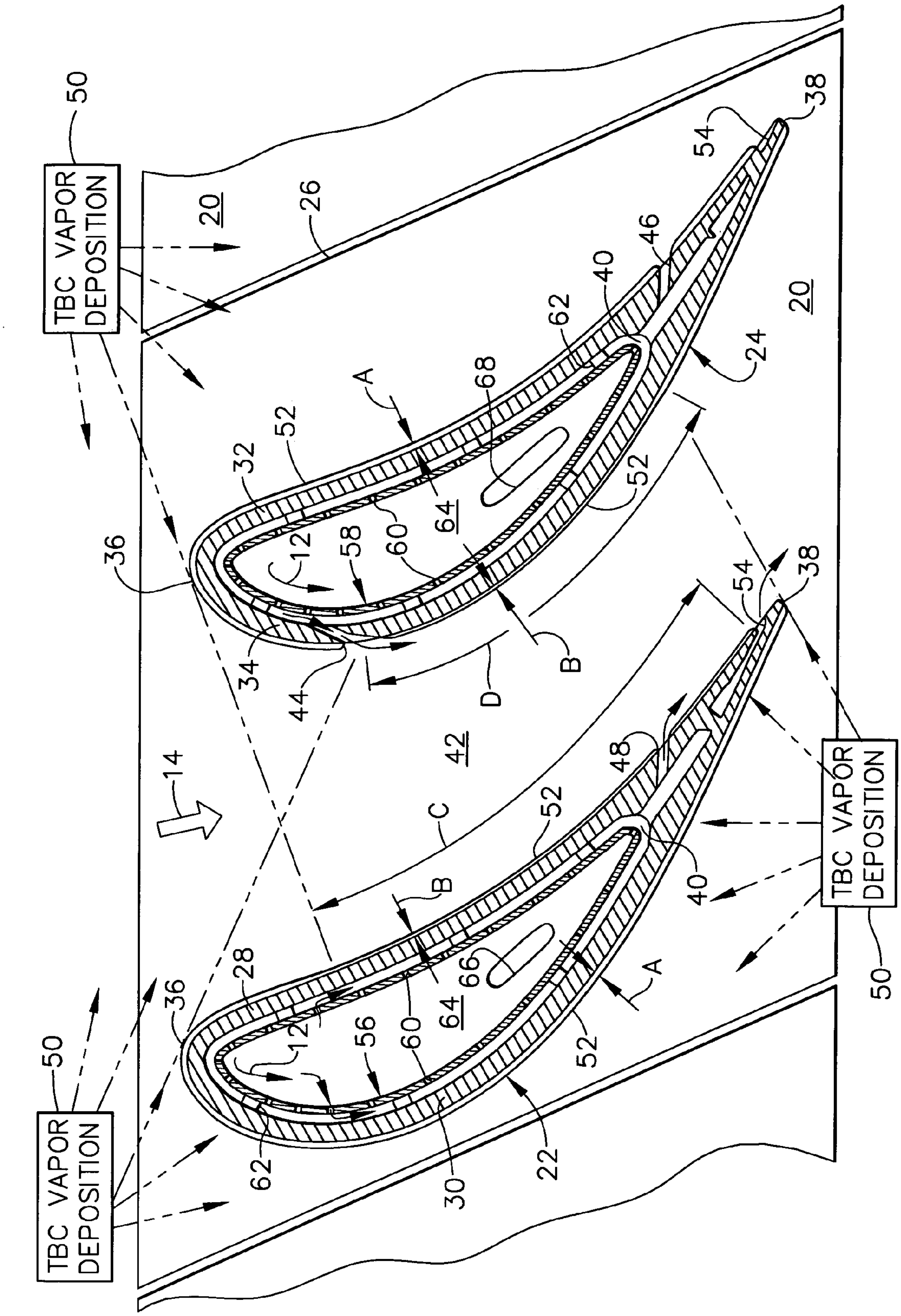
FIG. 4 is a planiform, radial sectional view of a portion of the nozzle illustrated in FIG. 1 and taken generally along the pitch or mid-span line labeled 4—4.

As shown in FIG. 4, the two vanes are spaced circumferentially apart from each other to define with the outer and inner bands a nozzle flow passage or channel 42 therebetween through which the combustion gases 14 are channeled during operation. The combustion gases are laterally bound by corresponding pressure and suction sidewalls of the vanes which face circumferentially inboard toward each other.

The pressure sidewall 28 of the first vane 22 and the suction sidewall 34 of the second vane 24 thusly face each other and define the cooperating inboard panels or sidewalls which extend radially between the two bands. The remaining suction and pressure sidewalls of the two vanes face circumferentially outboard at the opposite splitlines 26, and define with the vanes of the adjoining nozzle segments corresponding nozzle flow passages therewith. The suction sidewall 30 of the first vane 22 and the pressure sidewall 32 of the second vane 24 at the opposite splitlines therefore define the two outboard panels or sidewalls which extend radially between the outer and inner bands.

In this configuration, the two vanes 22,24 are integrally joined to the corresponding outer and inner bands in a unitary assembly defining one nozzle segment or doublet. A full row of such nozzle doublets are suitably joined together around the circumference of the nozzle and include spline seals (not shown) mounted at the respective splitlines 26 for sealing the joints thereat. As indicated above; each nozzle segment therefore operates structurally independently of adjacent nozzle segments in view of the interruption in circumferential continuity of the outer and inner bands.

As illustrated in FIGS. 2 and 3, the outer band 18 is circumferentially arcuate about the centerline axis of the nozzle itself, and is joined to the corresponding arcuate inner band 20 by the two vanes 22,24. As the combustion gases 14 flow through the nozzle passages defined between adjacent vanes, the vanes and bands are subject to different pressure and thermal loading in view of the different velocity and temperature distributions of the combustion gases over the pressure and suction sidewalls.

Accordingly, the outer band of each nozzle segment is subject to the chording affect described above in which the outer band tends to straighten in the circumferential direction, which straightening is restrained by the two vanes which bridge the outer band. Analysis indicates that the two inboard sidewalls are subject to corresponding thermally induced stress from the chording effect, which is different than the thermal stress induced in the two outboard sidewalls.

In order to reduce such thermal stresses in the inboard sidewalls of the two vanes, the nozzle is modified to introduce means for biasing more of the coolant 12 to the inboard sidewalls 28,34 than to the outboard sidewalls 30,32. In particular, the two vanes 22,24 preferably include different cooling configurations to bias the coolant between the inboard and outboard sidewalls. In other words, the cooling configurations for the two vanes 22,24 will no longer be identical as in conventional practice but, instead, will be suitably modified to introduce additional cooling of the inboard sidewalls in contrast with the outboard sidewalls, which is preferably effected without increasing the overall flowrate of coolant to each nozzle doublet.

For a given amount of coolant airflow to the nozzle doublet, the airflow may be preferentially redistributed between the two sidewalls of each vane, and even between both vanes to preferentially bias cool the inboard sidewalls.

The different cooling configurations for the two vanes 22,24 may be effected in various manners using modifications of conventionally known cooling elements. Although it is conventionally known to provide different cooling configurations for the opposite sides of nozzle vanes such conventional practice is nevertheless identical from vane to vane irrespective of the operational differences between the inboard and outboard sidewalls.

In the preferred embodiment, additional cooling air is provided to, the inboard sidewalls at the expense of the corresponding outboard sidewalls. And, the different cooling configurations may be additionally sized to effect different flowrates of the coolant through the pair of vanes, with one vane in the doublet receiving more air than the other vane in the doublet.

In the exemplary embodiment illustrated in FIGS. 2–4, each of the doublet vanes includes aperture outlets 44,46,48 through the corresponding sidewalls 34,32,28 thereof to effect the different cooling configurations for biasing the coolant flow. The introduction of otherwise conventional cooling apertures through the different sidewalls of the different vanes may be used to advantage to better cool the inboard sidewalls.

As shown in FIGS. 3 and 4 the outboard suction sidewall 30 is preferably imperforate between the leading and trailing edges of the first vane 22 without the need for discharging cooling air therethrough. Correspondingly, the inboard suction sidewall 34 of the second vane 24 includes a row of the first outlets 44 aligned in radial span along the vane.

The first outlets 44 illustrated in FIG. 4 preferably extend through the inboard suction sidewall 34 at a forward end of the plenum 40 in flow communication therewith inside the second vane 24, and slightly aft of the leading edge 36 thereof.

The inboard suction sidewall 34 is preferably imperforate between the leading and trailing edges of the second vane except for a single row of the first outlets 44. In this way, the row of first outlets 44 may be placed preferentially near the maximum width of the second vane 24 aft of the leading edge, with the sidewall 34 being imperforate forward therefrom to the leading edge 36 and aft therefrom to the trailing edge 38.

The first outlets 44 illustrated in FIG. 4 are preferably in the form of conventional diffusion film cooling holes having outlets on the suction side of the vane with flow area greater than their inlets inside the vane. As shown in FIG. 3, the discharge ends of the outlets 44 have a wide breakout configuration on the sidewall and distribute a film of cooling air therefrom which extends preferentially to the trailing edge of the second vane 24. In this way, the row of first outlets 44 provides local cooling of the inboard suction sidewall 34 of the second vane 24, whereas the outboard suction sidewall 30 of the first vane 22 is imperforate.

The different cooling performance of the two suction sidewalls 30,34 may be used to additional advantage upon the introduction of thermal barrier coating (TBC). More specifically, FIG. 4 illustrates schematically a conventional vapor deposition apparatus 50 for depositing TBC over the nozzle vanes during the manufacturing process. As indicated above, the TBC apparatus 50 is directional in application of the ceramic coating.

The TBC apparatus 50 may be conventionally operated so that the outboard sidewalls 30,32 of the vane pair are covered by a full thickness TBC 52 between the leading and trailing edges 36,38 of both vanes, with the full thickness TBC 52 also wrapping around the corresponding leading edges 36 of both vanes. The TBC 52 may have any conventional composition, such as a ceramic material, adhered to the metallic surface of the vanes with or without conventional bond coats. The full thickness application of the TBC is represented by the desired or nominal thickness A which may be in the range of about 6–10 mils (0.15–0.25 mm).

Correspondingly, the inboard sidewalls 28,34 of the two vanes are covered by a partial thickness or thinner TBC 52 extending aft from the full thick TBC wrapping around the leading edges.

FIG. 4 illustrates schematically the shadowing effect described above which occurs during conventional TBC vapor deposition. The second vane 24 casts a shadow over the pressure side of the first vane 22 in the shadow region designated C, in which region the deposited TBC has a correspondingly small magnitude B, which may range from the maximum thickness magnitude A locally down to almost zero thickness depending upon the specific profile of the vanes and the specific procedures for the vapor deposition process.

Correspondingly, the first vane 22 casts a shadow over the suction sidewall 34 of the second vane 24 during the TBC deposition process for correspondingly creating the shadow region D in which the TBC 52 is deposited with the relatively small thickness B compared to the full thickness A of the exposed outboard surfaces.

Note that the two shadow regions C,D have different extent on the different inboard pressure and suction sidewalls which are controlled by the conventional TBC deposition process. However, the TBC nevertheless provides an enhanced thermal insulation over the vane surfaces which not only enhances the thermal protection thereof, but may be used to advantage with the different-cooling configurations of the two vanes 22,24 for additionally reducing the thermal stresses carried by the inboard sidewalls 28,34 during operation.

In the preferred embodiment illustrated in FIG. 4, the outboard suction sidewall 30 is fully covered by the full thickness TBC 52 between the leading and trailing edges 36,38 of the first vane 22. Correspondingly, the inboard suction sidewall 34 of the second vane 24 is also covered by the full thickness TBC 52 forward of the first outlets 44, but covered by the partial or thinner thickness TBC 52 aft of the first outlets 44 in the shadow region D.

It should be noted that both outboard sidewalls 30,32 include full thickness TBC in contrast with the corresponding inboard sidewalls 28,34 which include partial thickness TBC. As indicated above, the conventional practice is to introduce suitable masking of the two vanes 22,24 so that the shadow region C of the first vane 22 would be provided along the outboard pressure sidewall 32 of the second vane 24. And, conventional practice would use the masks to introduce the shadow region D of the inboard suction sidewall 34 in the corresponding position along the outboard suction sidewall 30 of the first vane 22.

In this way, the TBC configuration for both vanes 22,24 would be identical in accordance with conventional practice, but in accordance with the teachings herein, the masks are eliminated and the corresponding shadow regions on the outboard sidewalls are also eliminated so that the outboard sidewalls may enjoy the additional protection of full thickness TBC thereon. That full thickness protection provides additional advantage in cooperation with the different cooling configurations of the two vanes as further described hereinbelow.

Since the outboard suction sidewall 30 is preferably imperforate, the available full thickness TBC 52 thereon provides adequate cooling thereof without the need for any film cooling apertures therein. Correspondingly, since the inboard suction sidewall 34 has the region of partial thickness TBC 52, the row of first outlets 44 is preferentially introduced at the commencement of the partial thickness TBC to discharge a film of cooling air over the thin TBC and provide locally enhanced thermal insulation against the hot combustion gases.

FIG. 4 also illustrates that the inboard suction sidewall 34 is also covered by the full thickness TBC 52 forward of the trailing edge 38 of the second vane 24, which TBC hen blends with the partial thickness TBC extending toward the first outlets 44. The shadow region D forms a minor portion of the inboard suction sidewall spaced between the opposite leading and trailing edges, with the thickness of the TBC varying from full thickness A at the opposite axial ends of the shadow region D and suitably blending with the thinner TBC within the shadow region D.

As indicated above, the outboard and inboard pressure sidewalls 32,28 of the two vanes preferably include the corresponding rows of second and third aperture outlets 46,48 which may be used to advantage in differently cooling the inboard and outboard sidewalls of the two vanes, while additionally cooperating with the different thickness TBC 52. In particular, the two rows of outlets 46,48 preferably have different configurations, with correspondingly different flowrates of coolant therethrough.

The second outlets 46 illustrated in FIG. 4 preferably extend through the outboard pressure sidewall 32 aft of the plenum 40 in the second vane 24 and forward of the trailing edge 38 thereof. The corresponding plenums 40 in the two vanes provide a common radial passage through each vane spaced upstream from the thin trailing edge regions of those vanes. The two rows of outlets 46,48 are suitably joined in flow communication through conventional channels between the sidewalls which join the respective plenums. Similarly, the third outlets 48 extend through the inboard pressure sidewall 28 aft of the plenum 40 in the first vane and forward of the trailing edge 38 thereof.

The second and third outlets 46,48 themselves may be identical to each other, but the rows thereof preferably have different configurations for biasing the cooling air between the outboard and inboard sidewalls. For example, the row of first outlets 46 illustrated in FIG. 2 may be limited in number to nineteen holes, which is correspondingly fewer in number than the twenty-one third outlets 48 in the row thereof.

The two pressure sidewalls 28,32 are preferably imperforate forward of the corresponding rows of second and third outlets 46,48 all the way to the corresponding leading edges 36 of the two vanes.

Both vanes 22,24 as illustrated in FIGS. 1, 2, and 4 preferably also include corresponding rows of trailing edge outlets 54 disposed adjacent the corresponding trailing edges 38 thereof in flow communication with the corresponding plenums 40 in the vanes. The rows of trailing edge outlets 54 may have any conventional configuration and typically are initially cast with the vanes, with corresponding channels extending aft from the plenurns 40 to the respective trailing edges 38. The pressure-side outlets 46,48 extend through the respective sidewalls in flow communication with the internal channels which also feed the trailing edge outlets 54 in a conventional manner.

In order to limit the discharge of cooling air from the two pressure sidewalls 28,32 of the vanes, both sidewalls are imperforate between the trailing edges 38 and the corresponding rows of second and third outlets 46,48.

The second and third outlets 46,48 are preferably in the form of conventional film cooling holes inclined aft and extending through the corresponding pressure sidewalls 32,28 for providing film cooling downstream therefrom. These outlets may be formed by conventional EDM, and are typically cylindrical.

Correspondingly, the trailing edge outlets 54 may also have conventional forms such as pressure-side bleed slots terminating along the pressure sidewalls just forward of the respective trailing edges 38 of the two vanes.

As indicated above, the vanes preferably include the TBC 52 on both sides thereof, with the outboard pressure sidewall 32 being covered by the full thickness TBC 52 between the leading and trailing edges 36,38 of the second vane 24 and around the second outlets 46 formed through the TBC.

Correspondingly, the inboard pressure sidewall 28 is covered by the partial thickness TBC between the leading and trailing edges 36,38 of the first vane 22, and around the third outlets 48 which are formed through that TBC.

The full thickness TBC 52 illustrated in FIG. 4 surrounds or wraps around the leading edges 38 of both vanes 22,24, and extends aft along the outboard pressure sidewall 32 short of the trailing edge outlets 54 in the second vane 24. The full thickness TBC 52 also extends aft along the inboard pressure sidewall 28 from the leading edge of the first vane 22 to blend with the partial thickness TBC in the shadow region C.

The partial thickness TBC 52 extends aft along the inboard pressure sidewall 28 of the first vane 22 short of the trailing edge outlets 54 thereof. The two rows of outlets 54 in the two vanes 22,24 are suitably masked during the vapor deposition process to prevent the accumulation of the TBC thereover, which might undesirably plug these pre-cast holes.

The nozzle vanes illustrated in the several figures may also include various other conventional cooling features as desired which complement the desired different cooling configurations disclosed above. For example, FIG. 1 illustrates the use of a pair of impingement inserts or baffles 56,58 suitably disposed or suspended inside the corresponding plenums 40 of the two vanes.

The baffles may be conventional in composition, shape, and construction except as modified for complementing the desired different cooling configurations disclosed above. Since the two vanes 22,24 are substantially identical to each other except as modified above, the two impingement baffles are preferably different from each other to complement bias cooling of the inboard vane sidewalls.

More specifically, each of the two baffles 56,58 illustrated in FIGS. 1 and 4 includes suitable patterns of small impingement cooling holes 60 on their opposite pressure and suction sides corresponding with the internal surfaces of the pressure and suction sides of each vane in which they are mounted. Since the two baffles include different impingement hole patterns, the baffles are not identical to each other, with the first impingement baffle 56 being specifically configured for use solely in the corresponding first vane 22, and the second impingement baffle 58 being specifically configured solely for use in the second vane 24.

The impingement hole patterns in the two baffles are preferably configured to distribute more of the available coolant 12 in each of the vanes to the inboard sidewalls 28,34 than to the corresponding outboard sidewalls 30,32. In this way, the impingement baffles cooperate with the sidewall outlets 44,46,48 described above to collectively effect the desired different cooling configurations of the two vanes for preferentially cooling the inboard sidewalls thereof for the benefits previously disclosed.

Figure 5:
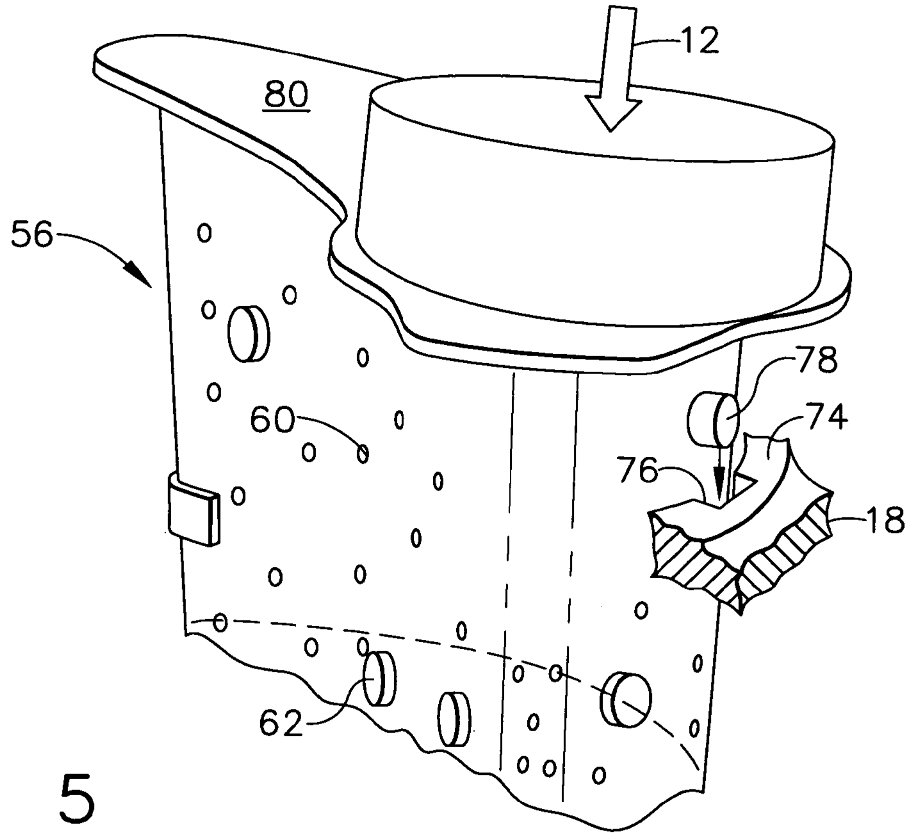
FIG. 5 is an enlarged isometric view of the top portion of the first impingement baffle illustrated in FIG. 1.
Figure 6:
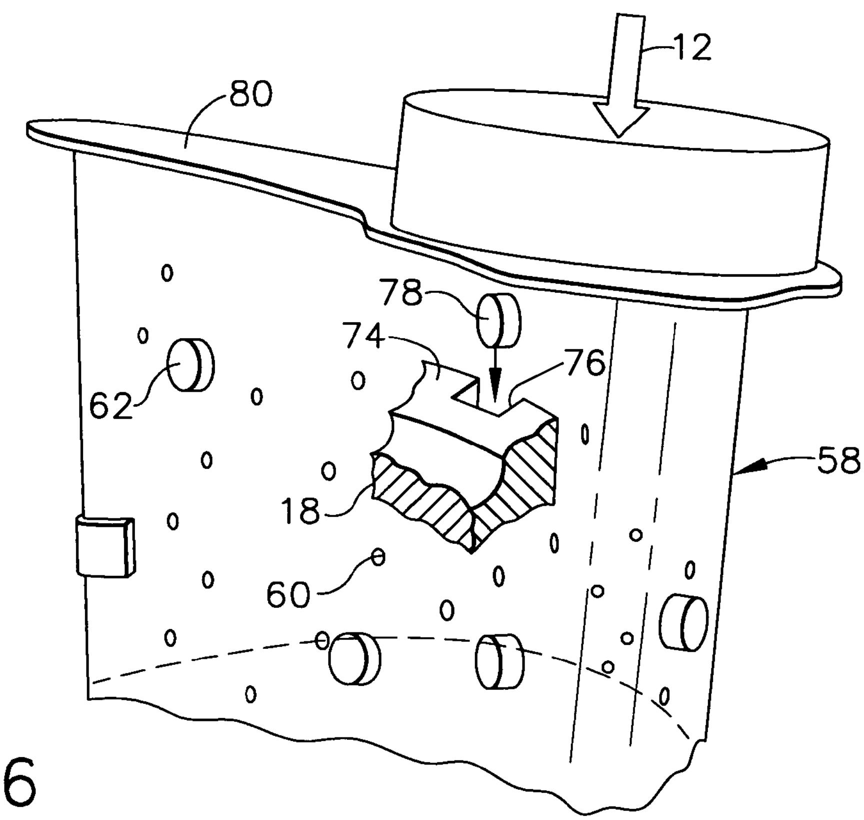
FIG. 6 is an enlarged isometric view of the top portion of the second impingement baffle illustrated in FIG. 1.

As shown in FIG. 4, the impingement baffles operate in a conventional manner to distribute the air coolant 12 through the small impingement cooling holes 60 to provide impingement cooling of the inner surface of the corresponding sidewalls. The impingement baffles include conventional spacers or pads 62 integrally joined to the outer surface thereof for maintaining a substantially constant gap between the baffles and the sidewalls. The baffles have corresponding airfoil or crescent configurations which match the similar configurations of the corresponding plenums 40 defined inside each vane FIGS. 5 and 6 illustrate the top portions of both impingement baffles in more detail including exemplary configurations of the impingement hole patterns therein, and several of the pads 62 attached to the outer surfaces thereof. FIG. 4 illustrates the impingement baffles installed into their respective vanes, and their relative positions inside the TBC-covered external surfaces of the vanes.

As indicated above, the two vanes have different configurations of TBC, with the majority of the TBC providing the full thickness coverage on the vanes, with the local minor shadow regions C,D having the partial thickness TBC. The impingement baffles may preferentially cooperate with the different thickness TBC by distributing more of the available coolant introduced into each vane to the inboard sidewalls 28,34 which include the partial thickness TBC, than against the full thickness TBC outboard sidewalls 30,32.

For example, the impingement hole patterns and vane outlets in the vane pair may be configured to distribute more of the coolant against the inboard sidewalls 28,34 corresponding with the partial thickness thermal barrier coating 52 in the two shadow regions C,D than against the outboard sidewalls 30,32 corresponding with the full thickness thermal barrier coating thereon. And, the impingement hole patterns may be further configured to distribute more of the coolant against the inboard suction sidewall 34 than against the inboard pressure sidewall 28.

Therefore, the two vanes in the nozzle doublet cooperate collectively to distribute the available coolant 12 therein locally biasing the corresponding inboard sidewalls thereof relative to the outboard sidewalls thereof, as well as distributing the available air differently between the two vanes of the doublet.

The impingement holes 60 used in the two baffles illustrated in FIG. 4 may have a conventional equal or uniform size of about 20 mils (0.5 mm) in both vanes, and differ in quantity and distribution to distribute more of the coolant in impingement against the internal surfaces of the inboard sidewalls 28,34. In one embodiment, the first baffle 56 in the first vane 22 has a pattern of one hundred and one impingement holes 60 in the suction side thereof, and a pattern of one hundred and nine impingement holes in the opposite pressure side. Correspondingly, the second baffle 58 in the second vane 24 has a pattern of one hundred and thirty impingement holes in its suction side, with its pressure side having a pattern of seventy-seven impingement holes therein.

Accordingly, in the preferred embodiment illustrated in FIG. 4, the impingement hole patterns in the two baffles 56,58 are different from each other along both the two inboard sidewalls 28,34 of the two vanes and along the two outboard sidewalls 30,32 of the vanes, resulting in four different patterns of the impingement holes in the four panels of the two impingement baffles.

These different patterns of impingement holes in the four opposite sides of the two impingement baffles are preferentially different from each other for providing the desired different cooling configurations disclosed above, and are exclusive of additional impingement cooling holes found at the opposite leading and trailing edges of the two baffles, which may have any conventional configuration.

The different patterns of impingement holes in the two baffles may be used with particular advantage to complement the introduction of the different thickness TBC over the outer surfaces of the vanes for directing more impingement cooling air to the inboard sidewalls which include the partial thickness TBC, than against the outboard sidewalls which include the full thickness TBC, which full thickness enjoys increased thermal protection by that full thickness thereof.

Figure 7:
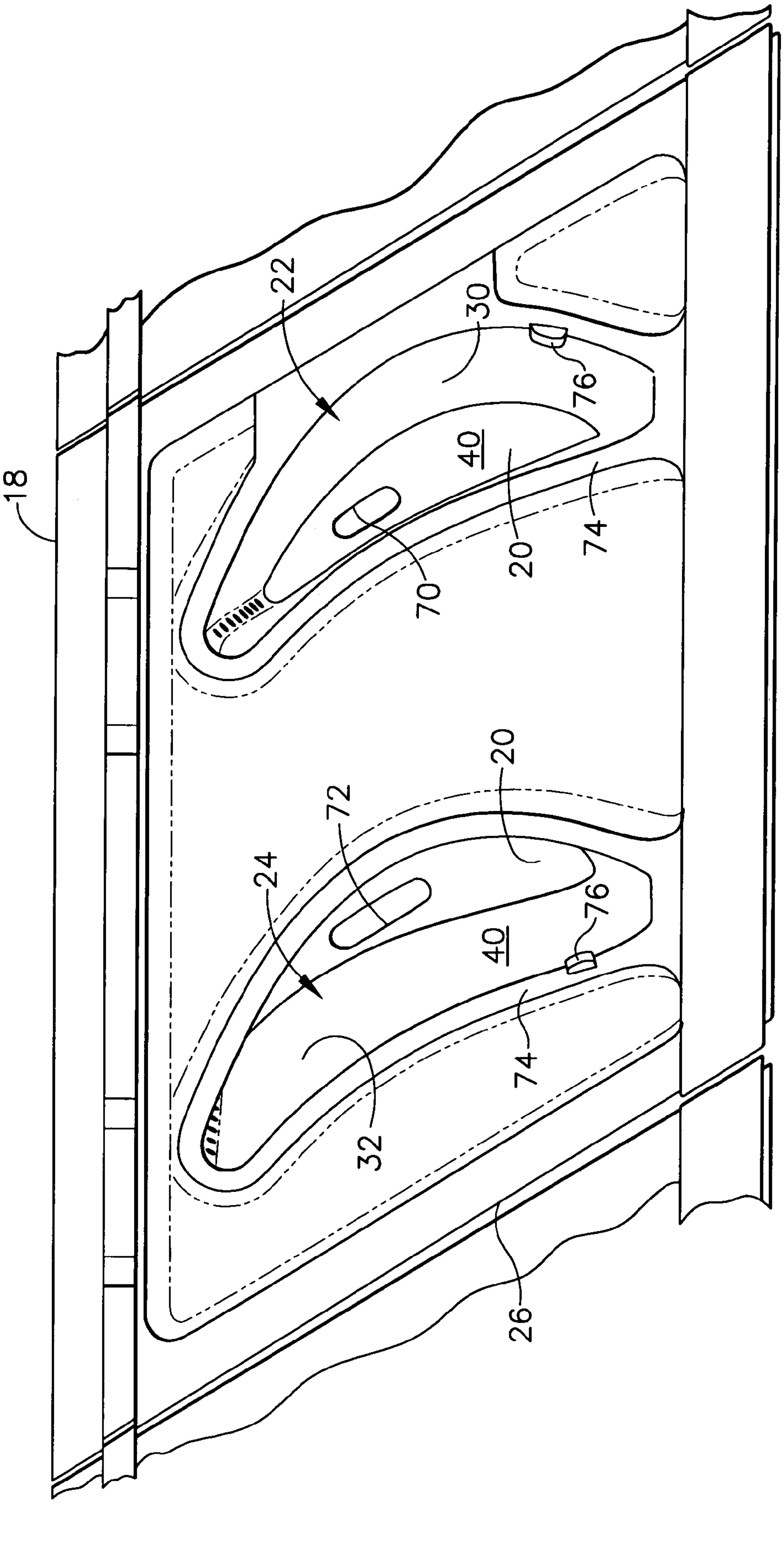
FIG. 7 is a top, planiform view of the turbine nozzle illustrated in FIG. 1 and taken generally along line 7—7.

As initially shown in FIGS. 1 and 4, each of the two baffles 56,58 includes a bottom plate or floor 64 at the radially inner ends thereof which when installed in the corresponding vanes is spaced slightly above corresponding pockets in the inner band 20. The first vane illustrated in FIG. 4 includes a first dump outlet 66 in the first baffle floor, and the second vane 24 includes a second dump outlet 68 in the second baffle floor. The baffle dump outlets cooperate with respective dump outlets 70,72 in the inner band as best illustrated in FIG. 7.

These dump outlets are conventional in location and purpose but are different in size to additionally cooperate with the different cooling configurations of the two vanes. Conventional dump holes are identical in size, and complement the identical configuration of conventional vanes and baffles.

However, the different cooling configurations desired in the improved duplex nozzle may be effected by various changes in the cooling configurations of the two vanes in each nozzle doublet. The flow area size of the second dump outlet 68 is preferably about twice as large as the flow area of the first dump outlet 66 which is used to advantage in achieving the desired different cooling configurations disclosed above.

In a conventional nozzle designed with identical vanes and identical cooling configurations thereof, the given quantity of cooling air supplied to each vane must be suitably distributed throughout that vane for cooling the different portions thereof in response to the different thermal loads applied externally of the vane by the hot combustion gases.

In contrast, the two vanes in the nozzle doublet may now be treated together with the collective or total coolant flow thereto being preferentially distributed not only within each vane itself, but between the two vane doublet recognizing the differences in mounting and applied loads for the two vanes in the band segments.

The total coolant airflow to each vane is differently distributed through the different baffles, and discharged through the different vane outlets and dump holes in a preferred manner. And, the total flow through each of the two vanes 22,24 is preferably different, with the total airflow through the trailing second vane 24 being about 10% greater than the total airflow through the leading first vane 22 in one embodiment.

As indicated above, the applied pressure and thermal loads on the two vanes during operation affects the thermal distortion of the two vanes and bands in the doublet, and the corresponding thermal stress therefrom. The different thermal loading of the inboard sidewalls of the vanes as opposed to the outboard sidewalls of the vanes may now be addressed by the ability to introduce different cooling configurations in the doublet vanes.

Heat transfer and flow circuit analysis of the operation of the improved nozzle doublet disclosed above indicates a significant reduction in operating temperature of the inboard sidewalls for given cooling flow when compared with a corresponding design having identical vanes and cooling configurations of conventional design. Furthermore, finite element analysis also indicates significant improvements in stress levels over the conventional design, with the thermally induced stresses being significantly lowered.

Accordingly, the improved nozzle doublet may be more durable with an extended life when cooled with a given amount of cooling air. Alternatively, less air may be bled from the compressor for nozzle cooling at the expense of the increased nozzle life.

Although the two vanes 22,24 have different cooling configurations, their aerodynamic contours and internal plenums 40 are identical to each other within typical manufacturing tolerances. Similarly, the two impingement baffles 56,58 are identical in shape and size to fit within the corresponding identical plenums 40 of the two vanes, but have different cooling configurations in the patterns of the air holes therein.

Accordingly, the two different baffles are not interchangeable in the two different vanes. To prevent the incorrect assembly of the different baffles in the different vanes, the baffles are further modified from conventional designs.

As initially illustrated in FIGS. 1 and 7, the outer band 18 includes corresponding seats 74 which define the inlet ends of the respective plenums 40 that extend downwardly through each vane to the inner band. As illustrated in FIG. 1, each of the baffles is inserted downwardly through each seat opening during the assembly process for being suspended inside the corresponding vane.

As shown in FIGS. 5–7, each of the baffle seats 74 includes a respective recess or socket 76 differently located above the vanes. For example, the socket 76 for the first vane 22 is located in the seat above the suction sidewall 30 near the leading edge. Correspondingly, the socket 76 for the second vane 24 is located above the pressure sidewall 32 near the leading edge.

Each of the baffles 56,58 illustrated in FIGS. 1, 5, and 6 includes a corresponding alignment pin 78 extending differently outwardly from the top or outer ends thereof, and the pins are disposed or seated in respective ones of the socket 76 during the assembly process.

The alignment pin 78 for the first baffle 56 illustrated in FIG. 5 is located on the suction side thereof above the corresponding socket 76, and the alignment pin 78 of the second baffle 58 illustrated in FIG. 6 is located on the pressure side thereof above the corresponding socket 76. Accordingly, the alignment pins and their mating sockets are disposed in the outer band in radial alignment with the corresponding outboard sidewalls 30,32 in the preferred embodiment for maximizing the differences in those alignment features.

In this way, the first baffle 56 cannot be physically installed in the second vane 24 because the alignment pin and socket would be on opposite sides of the second vane. Similarly, the second baffle 58 cannot be installed in the first vane 22 because the alignment pin and socket would be on opposite sides in the first vane.

The first baffle 56 may only be installed in the first vane 22 by proper alignment of the corresponding pin and socket, and similarly the second baffle 58 may only be installed in the second vane 24 upon proper alignment of the corresponding pin and socket. This assembly feature is commonly known as one type of Murphy-proofing feature and prevents the mis-assembly of otherwise similarly shaped components.

The two baffles illustrated in FIGS. 5 and 6 also include conventional top flanges 80 which enclose the outer ends of the baffles, and are configured for covering the corresponding seats 74 in the outer band. The flanges 80 include corresponding inlet tubes through which the air coolant 12 is conventionally provided from the compressor of the engine.

By the relatively simple introduction of different cooling configurations in the nozzle vanes, substantial improvement in durability may be obtained. As indicated above, conventional turbine nozzles typically include identical vanes and identical nozzle doublets for maintaining identical performance thereof notwithstanding the differences in pressure and thermal loading attributable to circumferentially segmenting the nozzle.

In contrast, the improved nozzle doublet disclosed above introduces relatively small changes in the nozzle configuration specifically addressed to the different pressure and thermal loading of the nozzle doublet for improving durability thereof. The cooling hole patterns in the nozzle vanes themselves may be differentiated between the lead and trail vane of each nozzle doublet. The thermal barrier coating of the two vanes in the doublet may also be differentiated from each other. The cooling configurations of the internal impingement baffles of the two vanes in the doublet may also be differentiated from each other. And, these individual differences may be preferentially used together for complementing the overall cooling configurations of the two vanes in the nozzle doublet for maximizing the reduction in operating temperature and thermal stress, while correspondingly increasing the durability of the doublet.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters Patent of the United States is the invention defined and differentiated in the following claims in which we claim:

1. A turbine nozzle comprising:

radially outer and inner bands integrally joined to a doublet of hollow vanes extending radially in span therebetween;

each of said vanes including circumferentially opposite pressure and suction sidewalls extending axially between opposite leading and trailing edges, and spaced apart to define an internal plenum extending radially between said bands for receiving an air coolant therein;

said vanes being spaced apart from each other to define a flow passage therebetween for channeling hot combustion gases bound by corresponding pressure and suction sidewalls of said vanes facing inboard toward each other, with the remaining suction and pressure sidewalls of said vanes facing outboard; and said doublet of vanes including different cooling configurations, to bias more of said coolant to said inboard sidewalls than to said outboard sidewalls.

2. A nozzle according to claim 1 wherein:

each of said vanes includes an impingement baffle disposed inside said plenum and aperture outlets extending through said sidewalls thereof; and said baffles and outlets cooperate to effect said different cooling configurations.

3. A nozzle according to claim 2 wherein said baffles include different patterns of impingement cooling holes therein.

4. A nozzle according to claim 3 wherein said impingement hole patterns are configured to distribute more of said coolant to said inboard sidewalls than to said outboard sidewalls.

5. A nozzle according to claim 4 wherein:

said outboard sidewalls of said vanes are covered by a full thickness thermal barrier coating between said leading and trailing edges and wrapping around said leading edges; and said inboard sidewalls of said vanes are covered by a partial thickness thermal barrier coating extending aft from said full thickness thermal barrier coating wrapping around said leading edges.

6. A nozzle according to claim 5 wherein:

said impingement hole patterns and vane outlets are configured to distribute more of said coolant against said inboard sidewalls corresponding with said partial thickness thermal barrier coating thereon than against said outboard sidewalls corresponding with said full thickness thermal barrier coating thereon; and said impingement hole patterns are further configured to distribute more of said coolant against said inboard suction sidewall than against said inboard pressure sidewall.

7. A nozzle according to claim 6 wherein:

said outboard suction sidewall is imperforate;

said inboard suction sidewall includes a row of first outlets;

said outboard pressure sidewall includes a row of second outlets; and said inboard pressure sidewall includes a row of third outlets.

8. A nozzle according to claim 7 wherein:

said inboard suction sidewall is imperforate between said leading and trailing edges except for a single row of said first outlets;

said second outlets extend through said outboard pressure sidewall aft of said plenum in said vane and forward of said trailing edge thereof; and said third outlets extend through said inboard pressure sidewall aft of said plenum in said vane and forward of said trailing edge thereof.

9. A nozzle according to claim 8 wherein:

said vanes further include corresponding rows of trailing edge outlets terminating along said pressure sidewalls forward of said trailing edges in flow communication with said corresponding plenums in said vanes; and said pressure sidewalls are imperforate except for said rows of second and third outlets trailing edge outlets.

10. A nozzle according to claim 9 wherein:

said first outlets comprise diffusion film cooling holes; and said second and third outlets comprise inclined film cooling holes extending through said pressure sidewalls.

11. A turbine nozzle comprising:

radially outer and inner bands integrally joined to a doublet of hollow vanes extending radially in span therebetween;

each of said vanes including circumferentially opposite pressure and suction sidewalls extending axially between opposite leading and trailing edges, and spaced apart to define an internal plenum extending radially between said bands for receiving an air coolant therein;

said vanes being spaced apart from each other to define a flow passage therebetween for channeling hot combustion gases bound by corresponding pressure and suction sidewalls of said vanes facing inboard toward each other, with the remaining suction and pressure sidewalls of said vanes facing outboard; and means for biasing more of said coolant to said inboard sidewalls than to said outboard sidewalls.

12. A nozzle according to claim 11 wherein said doublet of vanes includes different cooling configurations to effect said coolant biasing between said inboard and outboard sidewalls.

13. A nozzle according to claim 12 wherein said different cooling configurations are sized to effect different flowrates of said coolant through said vane.

14. A nozzle according to claim 12 wherein each of said vanes includes aperture outlets through said sidewalls thereof to effect said different cooling configurations.

15. A nozzle according to claim 14 wherein said outboard suction sidewall is imperforate and said inboard suction sidewall includes a row of first outlets.

16. A nozzle according to claim 15 wherein said first outlets extend through said inboard suction sidewall at a forward end of said plenum in said vane and aft of said leading edge thereof.

17. A nozzle according to claim 16 wherein said inboard suction sidewall is imperforate forward to said leading edge and aft to said trailing edge from said first outlets therein.

18. A nozzle according to claim 17 wherein said first outlets comprise diffusion film cooling holes.

19. A nozzle according to claim 17 wherein:

said outboard suction sidewall is covered by a full thickness thermal barrier coating between said leading and trailing edges of said vane; and said inboard suction sidewall is covered by a full thickness thermal barrier coating forward of said first outlets, and a partial thickness thermal barrier coating aft of said first outlets.

20. A nozzle according to claim 19 wherein said inboard suction sidewall is covered by a full thickness thermal barrier coating forward of said trailing edge of said vane that blends with said partial thickness thermal barrier coating extending toward said first outlets.

21. A nozzle according to claim 14 wherein said outboard and inboard pressure sidewalls include corresponding rows of second and third outlets having different configurations.

22. A nozzle according to claim 21 wherein:

said second outlets extend through said outboard pressure sidewall aft of said plenum in said vane and forward of said trailing edge thereof; and said third outlets extend through said inboard pressure sidewall aft of said plenum in said vane and forward of said trailing edge thereof.

23. A nozzle according to claim 21 wherein said pressure sidewalls are imperforate forward of said corresponding second and third outlets to said corresponding leading edges.

24. A nozzle according to claim 23 wherein said vanes further include corresponding rows of trailing edge outlets disposed adjacent said trailing edges thereof in flow communication with said corresponding plenums therein.

25. A nozzle according to claim 24 wherein said pressure sidewalls are imperforate between said trailing edge outlets and said rows of second and third outlets.

26. A nozzle according to claim 24 wherein said second and third outlets comprise inclined film cooling holes extending through said pressure sidewalls.

27. A nozzle according to claim 24 wherein said trailing edge outlets comprise slots terminating along said pressure sidewalls forward of said trailing edges.

28. A nozzle according to claim 24 wherein:

said outboard pressure sidewall is covered by a full thickness thermal barrier coating between said leading and trailing edges of said vane and around said second outlets; and said inboard pressure sidewall is covered by a partial thickness thermal barrier coating between said leading and trailing edges of said vane and around said third outlets.

29. A nozzle according to claim 28 wherein:

said full thickness thermal barrier coating surrounds said leading edges of said vanes, and extends aft along said outboard pressure sidewall short of said trailing edge outlets, and extends aft along said inboard pressure sidewall to blend with said partial thickness thermal barrier coating; and said partial thickness thermal barrier coating extends aft along said inboard pressure sidewall short of said trailing edge outlets.

30. A nozzle according to claim 12 wherein:

each of said vanes includes an impingement baffle disposed inside said plenum; and said baffles include different patterns of impingement cooling holes therein to effect said different cooling configurations.

31. A nozzle according to claim 30 wherein said impingement hole patterns are configured to distribute more of said coolant to said inboard sidewalls than to said outboard sidewalls.

32. A nozzle according to claim 31 wherein said baffle impingement holes have uniform size in both vanes, and differ in quantity to distribute more of said coolant in impingement against the internal surfaces of said inboard sidewalls.

33. A nozzle according to claim 32 wherein said impingement hole patterns in said baffles are different from each other along both said inboard sidewalls and along said outboard sidewalls.

34. A nozzle according to claim 30 wherein each of said baffles includes a floor spaced from said inner band, and said floor includes a dump outlet differently sized in said two baffles.

35. A nozzle according to claim 30 wherein:

said outer band includes corresponding seats through which said baffles are suspended in said vanes, each of said seats including a socket differently located above said vanes; and each of said baffles includes a corresponding alignment pin extending differently outwardly from outer ends thereof and disposed in respective ones of said sockets.

36. A nozzle according to claim 35 wherein said alignment pins and sockets are disposed in said outer band in alignment with said outboard sidewalls.

* * * * *